(12) United States Patent
Schelling et al.

(10) Patent No.: US 10,011,479 B2
(45) Date of Patent: Jul. 3, 2018

(54) MEMS STRUCTURAL COMPONENT INCLUDING A DEFLECTABLE DIAPHRAGM AND A FIXED COUNTER-ELEMENT AS WELL AS A METHOD FOR MANUFACTURING IT

(71) Applicant: Robert Bosch GmbH, Stuttgart (DE)

(72) Inventors: Christoph Schelling, Stuttgart (DE); Yvonne Bergmann, Altdorf (DE); Jochen Reinmuth, Reutlingen (DE)

(73) Assignee: ROBERT BOSCH GMBH, Stuttgart (DE)

( * ) Notice: Subject to any disclaimer, the term of this patent is extended or adjusted under 35 U.S.C. 154(b) by 0 days.

(21) Appl. No.: 14/314,624

(22) Filed: Jun. 25, 2014

(65) Prior Publication Data

US 2015/0001653 A1 Jan. 1, 2015

(30) Foreign Application Priority Data

Jun. 26, 2013 (DE) .................. 10 2013 212 173

(51) Int. Cl.
*B81C 1/00* (2006.01)
*B81B 3/00* (2006.01)
(52) U.S. Cl.
CPC ........ *B81C 1/00158* (2013.01); *B81B 3/0021* (2013.01); *B81B 2201/0257* (2013.01)
(58) Field of Classification Search
CPC .... B81B 3/0021; B81C 1/00158; H01L 29/84
See application file for complete search history.

(56) References Cited

U.S. PATENT DOCUMENTS

| 5,055,383 | A | * | 10/1991 | Koblinger | ............. | G03F 7/0035 |
|  |  |  |  |  |  | 257/E21.024 |
| 5,889,872 | A | * | 3/1999 | Sooriakumar | ....... | H04R 19/016 |
|  |  |  |  |  |  | 381/174 |
| 6,184,154 | B1 | * | 2/2001 | Dietze | ..................... | C23C 16/24 |
|  |  |  |  |  |  | 257/E21.136 |
| 7,885,423 | B2 | * | 2/2011 | Weigold | ................ | B81B 3/0037 |
|  |  |  |  |  |  | 381/174 |
| 2003/0109095 | A1 | * | 6/2003 | Boydston | ................ | C30B 25/18 |
|  |  |  |  |  |  | 438/200 |
| 2006/0076559 | A1 | * | 4/2006 | Faure | ...................... | C30B 25/18 |
|  |  |  |  |  |  | 257/49 |
| 2007/0160248 | A1 |  | 7/2007 | Sung |  |  |

(Continued)

FOREIGN PATENT DOCUMENTS

| DE | 693 25 732 | 4/2000 |
| WO | 2010/139498 | 12/2010 |

*Primary Examiner* — Daniel Luke
*Assistant Examiner* — Khatib Rahman
(74) *Attorney, Agent, or Firm* — Norton Rose Fulbright US LLP; Gerard Messina

(57) ABSTRACT

For simplifying the manufacture of a MEMS structural component including a deflectable diaphragm which spans an opening in the rear side of the structural component, and including a fixed counter-element, which is provided with passage openings, the counter-element from the base substrate of the MEMS structural component is patterned and the deflectable diaphragm is implemented in a layered structure on the base substrate. These measures are intended to improve the diaphragm properties and reduce the overall height of the MEMS structural component.

11 Claims, 8 Drawing Sheets

(56) References Cited

U.S. PATENT DOCUMENTS

| | | | |
|---|---|---|---|
| 2008/0175417 A1 | 7/2008 | Kok et al. | |
| 2009/0026561 A1* | 1/2009 | Reichenbach | B81C 1/00182 |
| | | | 257/416 |
| 2009/0169035 A1 | 7/2009 | Rombach et al. | |
| 2009/0232334 A1* | 9/2009 | Feyh | B81C 1/00246 |
| | | | 381/174 |
| 2011/0169125 A1* | 7/2011 | Reinmuth | H01L 21/0334 |
| | | | 257/506 |
| 2012/0189152 A1* | 7/2012 | Reinmuth | H04R 19/005 |
| | | | 381/369 |
| 2013/0334626 A1* | 12/2013 | Weber | 257/416 |

\* cited by examiner

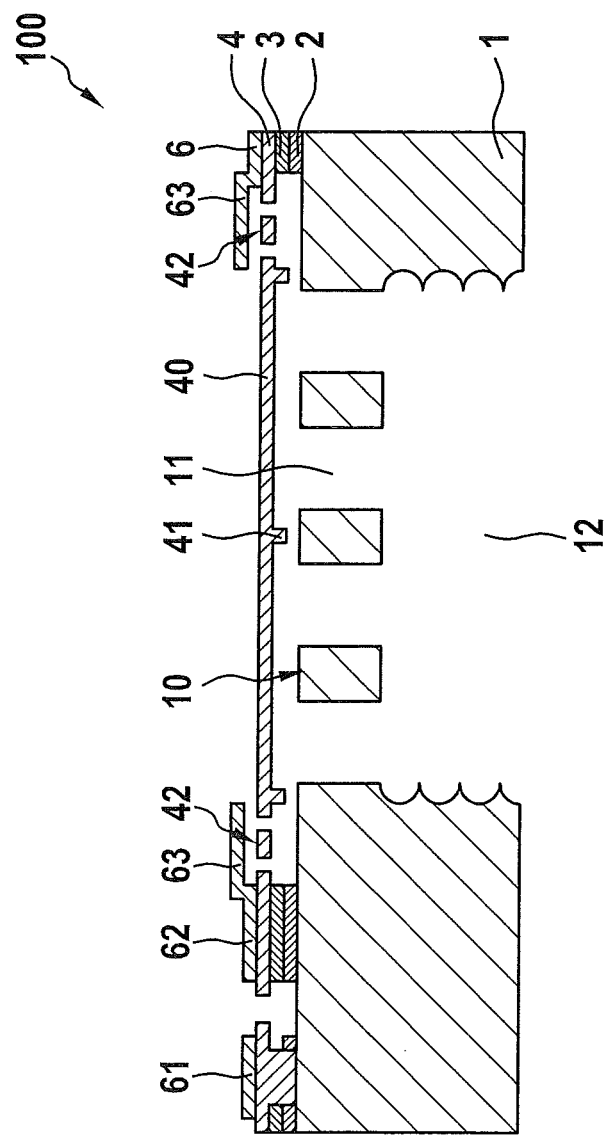

MEMS STRUCTURAL COMPONENT INCLUDING A DEFLECTABLE DIAPHRAGM AND A FIXED COUNTER-ELEMENT AS WELL AS A METHOD FOR MANUFACTURING IT

RELATED APPLICATION INFORMATION

The present application claims priority to and the benefit of German patent application no. 10 2013 212 173.3, which was filed in Germany on Jun. 26, 2013, the disclosure of which is incorporated herein by reference.

FIELD OF THE INVENTION

The present invention relates to a MEMS structural component, including at least one deflectable diaphragm, which spans an opening in the rear side of the structural component and which is provided with at least one deflectable electrode of a capacitor system, and a fixed counter-element having passage openings, the counter-element functioning as a carrier for at least one fixed electrode of the capacitor system. In particular, the present invention relates to a method for manufacturing such a MEMS structural component.

BACKGROUND INFORMATION

MEMS structural components of the type discussed here may—depending on the configuration of the component structure—assume both actuator functions and sensor functions. Thus, such a MEMS structural component may be configured, for example, as a valve component, in which the diaphragm is used as a closure element. In this case, the capacitor system is used for selectively activating or actuating the closure element. In another actuator application, the diaphragm of the component structure functions as a speaker diaphragm and is activated with the aid of the capacitor system. A MEMS structural component of the type discussed here may, however, also be configured as a pressure sensor or a microphone structural component. In these applications, the diaphragm is used for signal detection in that the deflections of the diaphragm caused by pressure or sound pressure are detected as capacitance changes of the capacitor system.

In WO2010/139498A1, a MEMS structural component of the above-named type is described, a microphone structure including an acoustically active diaphragm and an acoustically permeable counter-element being implemented in the layered structure of the MEMS structural component. In this case, the diaphragm is formed in a diaphragm layer above the base substrate of the structural component and spans a sound opening in the rear side of the substrate. The counter-element is implemented in another layer above the diaphragm. The diaphragm functions as a movable electrode and, together with a fixed electrode on the counter-element, forms a capacitor system for signal detection.

Since the counter-element of the known MEMS structural component is formed in another normally relatively thick layer of the layered structure, it contributes significantly to the overall height of the structural component. The manufacturing of the known MEMS structural component also proves to be problematic in several respects. The counter-element is, in this case, only applied after the diaphragm in the layered structure of the structural component. For that purpose, a relatively thick layer, as for example in an epi-polysilicon layer, is normally applied to the layered structure, since the position fixing of the counter electrode is a requirement for reliable signal detection. The deposition of such an epi-polysilicon layer requires very high process temperatures which have an adverse impact on the properties of the already produced diaphragm. Furthermore, these high temperature steps are relatively complex in terms of manufacturing, as is also the structuring of the relatively thick counter-element layer and the production of the rear side sound opening in a rear side etching process.

SUMMARY OF THE INVENTION

The present invention describes measures which contribute to both improving the diaphragm properties and miniaturizing the MEMS structural component. Moreover, these measures simplify the manufacturing process.

According to the present invention, this is achieved by patterning the counter-element from the base substrate of the MEMS structural component and implementing the deflectable diaphragm in a layered structure on the base substrate.

Since the counter-element is "buried" in the base substrate, it is possible for the MEMS structural component according to the present invention to be implemented to have a particularly low overall height. A suitable layout of the counter-element makes it possible to achieve very good position fixing within the component structure. In this connection, the mechanical properties of the base substrate usually have a positive effect on the position stability of the counter-element, in particular in the case of a monocrystalline base substrate.

According to the present invention, the counter-element is created in the base substrate before the diaphragm is produced in a layered structure on the base substrate. The process parameters when exposing the counter-element thus have no effects on manufacturing the diaphragm or the diaphragm properties. Independent of this, it is consequently possible to set the mechanical properties of the diaphragm selectively, for example, via the material and the thickness of the diaphragm layer, the layout of the diaphragm and the diaphragm suspension, and also using a suitable temperature treatment, if only low temperature processes are provided after that.

Basically, there are various possibilities for the implementation of the component structure according to the present invention, in particular with respect to the layout of the counter-element and the diaphragm, as well as the layer sequence of the layered structure on the base substrate, but also with respect to the manufacturing method.

In a variant of the manufacturing method, the counter-element having the passage openings is created in the front side of the base substrate using a trench etching method. This method is in particular suitable for defining the layout and the thickness of the counter-element, since it makes it possible to produce etched trenches or trenches having a very high aspect ratio. In another etching step, the counter-element is then undercut, a cavern being produced in the base substrate. In this connection, the etching attack takes place via the previously produced etched trenches for defining the counter-element.

It is a particular advantage if the front side of the base substrate is provided with an etch mask for creating and undercutting the counter-element, the etch mask having a lattice structure in the area of the trenches to be generated. The mesh size of the lattice structures is selected in such a way that they are each completely undercut during the creation of the counter-element and a contiguous trench is produced under each lattice structure. With the aid of the lattice structures in the etch mask, it is possible to simply re-close the front side of the base substrate after the counter-element is undercut, in order to create a basis for the layered structure including the diaphragm. For that purpose, at least one intermediate layer is applied to the masked front side of the base substrate. Based on the mesh size, the lattice structures above the trenches are closed, even before the structure of the counter-element and the volume under the counter-element may be significantly adversely affected.

The etch mask may be implemented in a simple manner in an oxide layer. Such oxide hard masks are extremely robust with regard to a trench process and also isotropic etching processes, such as those which may be used for undercutting the counter-element. On the other hand, the oxide material may also be removed selectively in a very simple manner using a gas phase etching method, in order to expose the counter-element and the diaphragm. For that reason, the etching mask may also be re-closed with the aid of an oxide intermediate layer.

The diaphragm layer is advantageously applied to the closed layer sequence of the etching mask and at least one intermediate layer. The diaphragm is then patterned from the diaphragm layer, if necessary together with a diaphragm suspension in the form of spring elements. In this case, the diaphragm may be exposed in a simple manner by removing the etching mask in areas, which advantageously takes place at the end of the manufacturing process via the opening in the rear side of the structural component. A polysilicon layer is in particular suitable as a diaphragm layer, since it may be structured in a simple manner, and its electrical and mechanical properties may be influenced selectively in a very simple manner by suitable doping and tempering.

In a specific embodiment of the present invention, the rear side of the base substrate is thinned in order to open the rear side of the cavern under the counter-element. This proves to be advantageous not only with respect to a maximally low overall height, but it is also associated with significantly lower manufacturing complexity than a rear-side structuring of the base substrate. For back-thinning, the base substrate may be simply ground. However, dry or wet chemical etching methods may also be used.

As has already been discussed above, there are various options for embodying and refining the present invention in an advantageous manner. To that end, reference is made, on the one hand, to the claims subordinated to the independent claims and, on the other hand, to the following description of an exemplary embodiment of the present invention based on the drawings.

BRIEF DESCRIPTION OF THE DRAWINGS

FIGS. 1a, 1b, 1c, 1d, 1e, 1f, 1g and 1h illustrate the manufacture of a MEMS structural component according to the present invention based on schematic cross-sectional representations through the component structure during the manufacturing method.

DETAILED DESCRIPTION

Figure 1A:
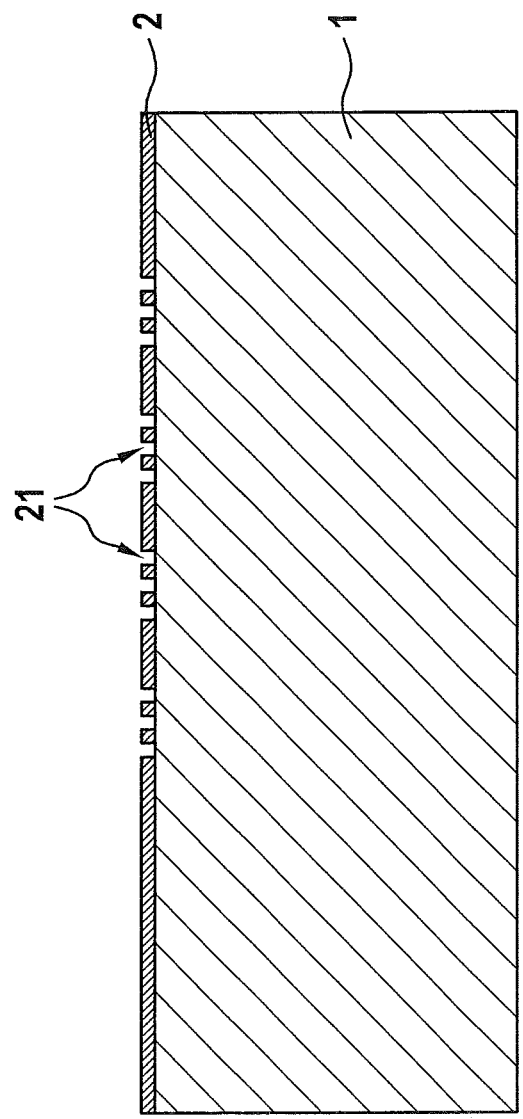

The manufacturing method according to the present invention will be described below based on the example of a MEMS microphone structural component 100—FIG. 1h—including a deflectable diaphragm 40 and a fixed counter-element 10. Diaphragm 40 is acoustically active and spans an opening 12 in the rear side of the structural component. Counter-element 10 is provided with passage openings 11, which are used as vent holes, and is consequently acoustically permeable. Acoustically active diaphragm 40 functions as a movable electrode, and together with a counter-electrode on fixed counter-element 10, forms a capacitor system for signal detection. According to the present invention, counter-element 10 is patterned from base substrate 1 of structural component 100 and diaphragm 40 is implemented in a layered structure on base substrate 1.

The starting point for the manufacture of a MEMS structural component of the type under discussion here is a base substrate 1, such as a monocrystalline silicon substrate. In the exemplary embodiment described here, the counter-element is first patterned from this base substrate 1. Base substrate 1 is structured in two consecutive etching steps, for which the front side of base substrate 1 is masked. In this case, a thin oxide layer 2 is used as masking layer 2, which, for example, is deposited on base substrate 1 using an LPCVD-TEOS method or may also be grown thermally and then structured following the layout of the counter-element. FIG. 1a shows base substrate 1 having structured masking layer 2. In masking layer 2, fine lattice structures 21 are formed in the areas in which etched trenches are to be produced in base substrate 1.

Figure 1B:
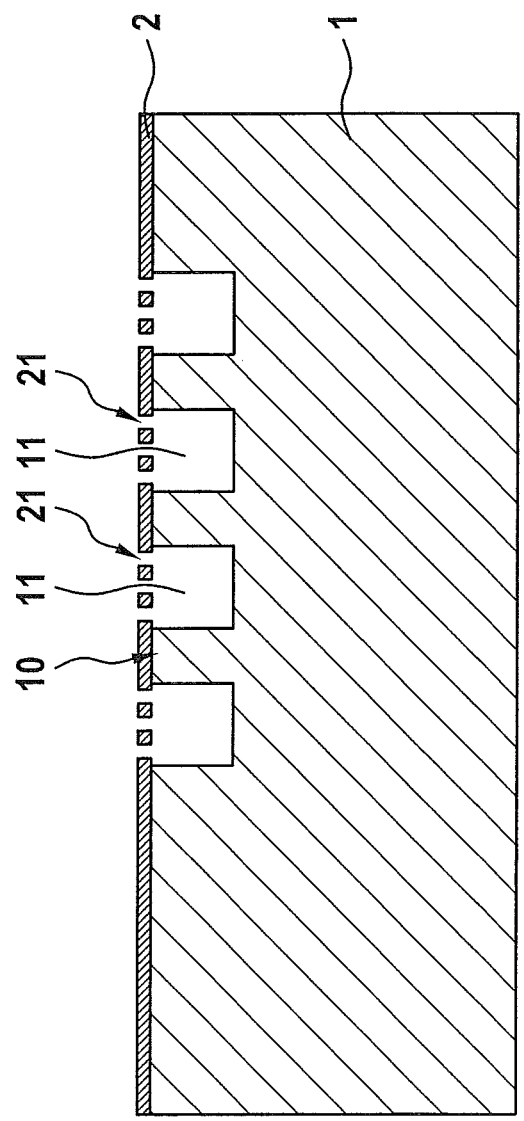

The mesh size of these lattice structures 21 is selected in such a way that lattice structures 21 are undercut in the first etching step—in this case an anisotropic trench etching process. In this connection, a contiguous trench 11, as shown in FIG. 1b, is produced beneath each lattice structure 21. The position, form and depth of these trenches 11 define the layout and the thickness of counter-element 10 having the passage openings.

Figure 1C:
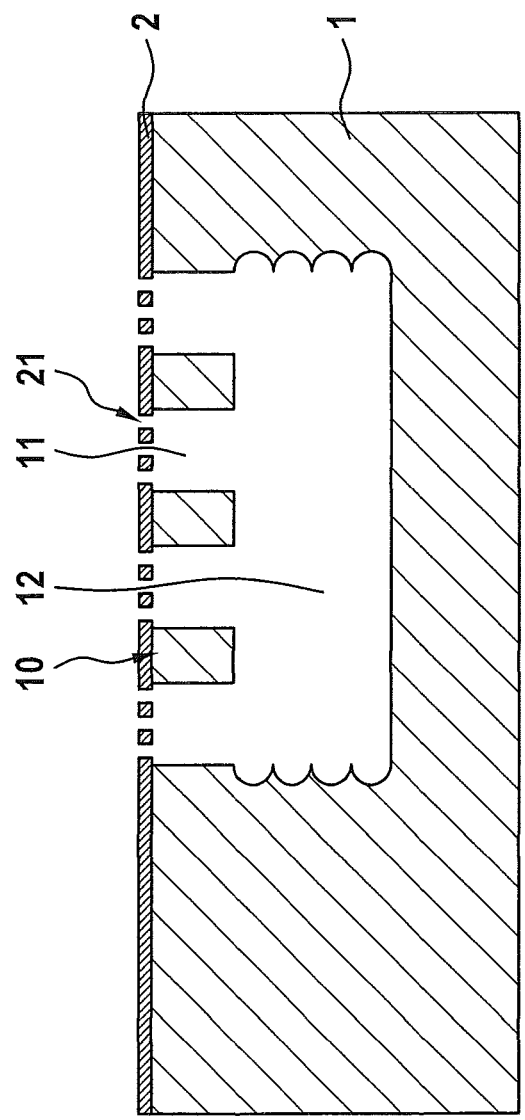

In a second etching step, counter-element 10 is undercut, the etching attack occurring via trenches 11 in the front side of base substrate 1. In this second etching step, the etching is either only isotropic or the undercutting of the trench process is set to be strong enough that the substrate material is removed from a contiguous area under counter-element 10. Cavern 12 produced in this manner under counter-element 10 is shown in FIG. 1c. FIG. 1c illustrates that trenches 11 form passage openings 11 or vent holes in the center area of counter-element 10.

After counter-element 10 has been patterned from base substrate 1, the surfaces of trenches 11 are closed in base substrate 1. For that purpose, an intermediate layer 3—in this case an oxide layer—is produced on the masked front side of base substrate 1, which in particular closes lattice structures 21 in masking layer 2. Oxide layer 3 may also be deposited on the masked front side of base substrate 1 using an LPCVD-TEOS method.

Optionally, a thermal oxidation may take place in advance, in order to produce an oxide layer on the cavern walls, it being possible to use the oxide layer as an etch stop layer in a subsequent etching process.

Figure 1D:
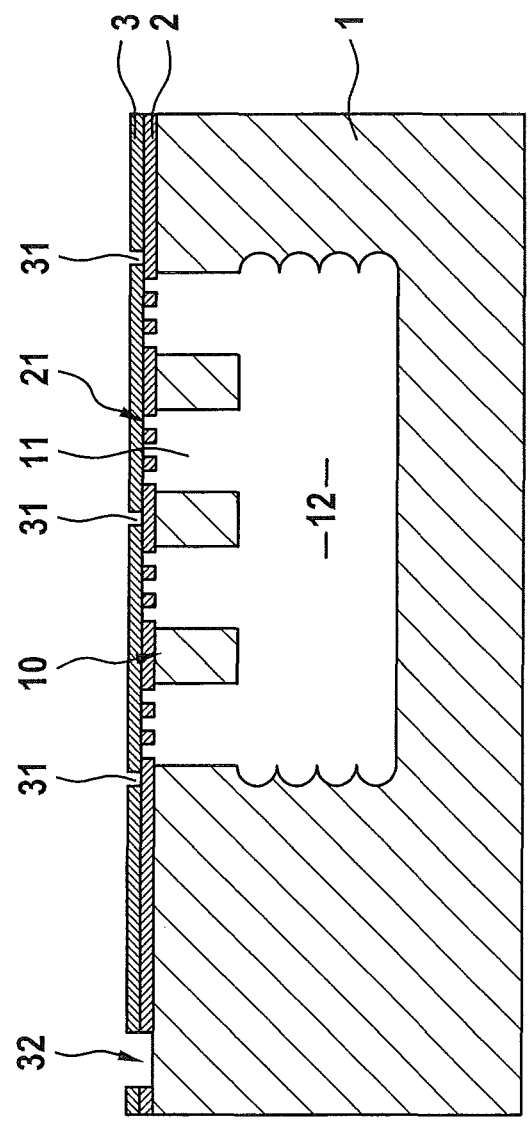

FIG. 1d shows that oxide layer 3 was provided with recesses 31 above the area of counter-element 10 in the exemplary embodiment described here. These recesses are used for forming stops in the diaphragm still to be produced, which are intended to prevent extensive adhesion of the diaphragm on the counter-element. Moreover, a contact opening 32 was produced in intermediate layer 3 and masking layer 2 in order to make electrical contacting of base substrate 1 and accordingly of counter element 10 possible.

Figure 1E:
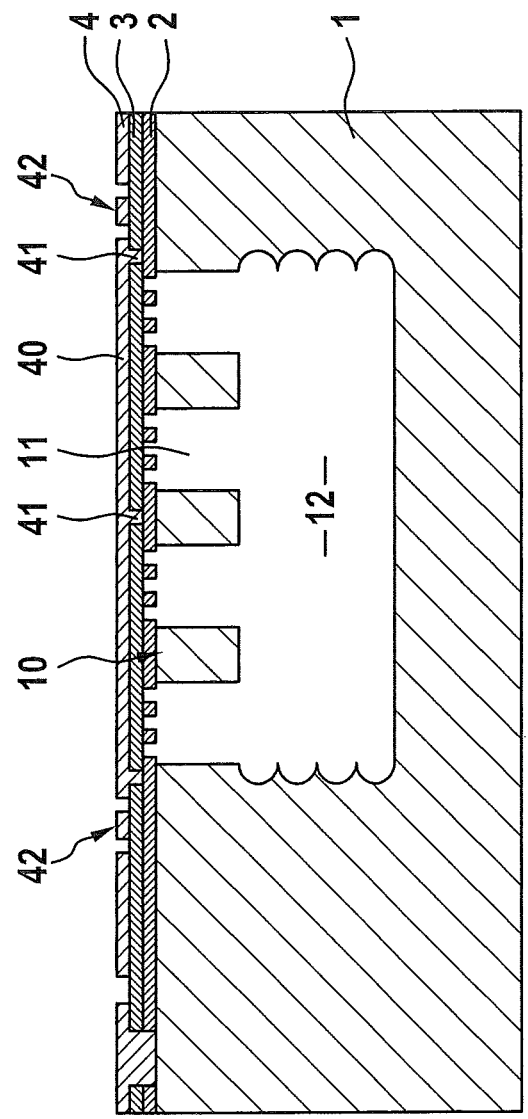

As shown in FIG. 1e, a diaphragm layer 4 was then deposited and structured on the layer sequence of masking layer 2 and intermediate layer 3, which was structured in this manner. A diaphragm 40 having stops 41 was produced, the diaphragm extending across the entire surface of counter-element 10.

Diaphragm 40 is incorporated in the layered structure on base substrate 1 via spring elements 42, which are also patterned from diaphragm layer 4. Diaphragm layer 4 is advantageously a polysilicon layer whose electrical properties may be set very well by suitable doping and whose mechanical properties may be improved selectively by tempering.

Figure 1F:
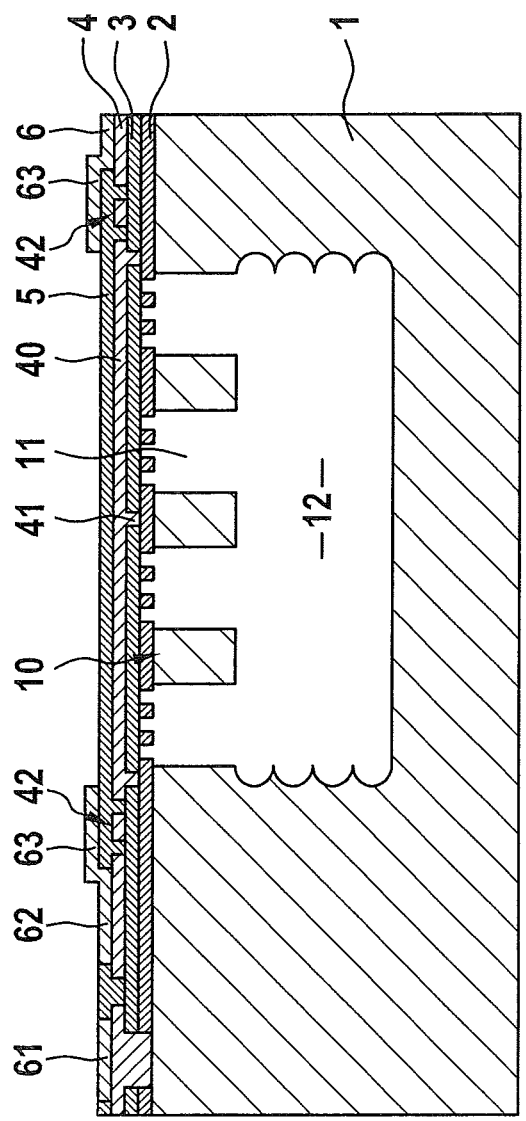

In the exemplary embodiment described here, an additional oxide layer 5 was deposited and structured above structured diaphragm layer 4, in order to produce stop structures 63 in a superposed metallic layer 6 in the area above spring elements 42. These stop structures 63 protect the diaphragm structure from spring fractures in the event of an overload. Metallic layer 6 is, however, primarily used for implementing terminal contacts 61, 62 for base substrate 1 or counter-element 10 and diaphragm 40. For that purpose, aluminum may be deposited and structured on the layered structure, which is shown in FIG. 1f.

Figure 1G:
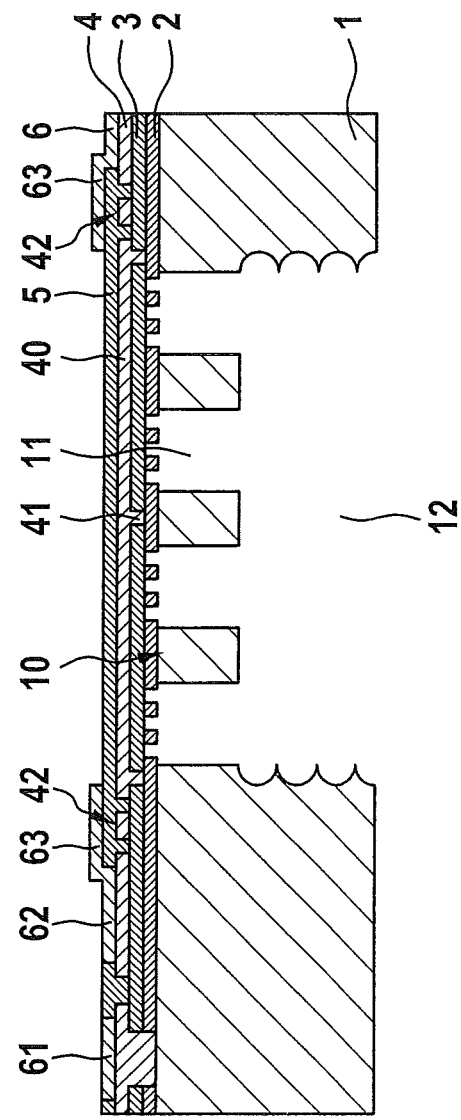

After the processing of the front sides is completed, the rear side of base substrate 1 is thinned. FIG. 1g shows that cavern 12 is opened under counter-element 10. A grinding method may be used for that purpose. Any grinding residues present may be removed from cavern 12 by cleaning steps. To avoid grinding residues in cavern 12, however, it is also possible to grind just up to cavern 12, in order to later open the rear side of the cavern with the aid of dry or wet etching methods.

Finally, counter-element 10 and diaphragm 40 having spring elements 42 are exposed by removing the oxide of masking layer 2 and intermediate layer 3 from the area of the microphone structure. An HF gas phase etching method may be used for that purpose. In this connection, oxide layer 5 on diaphragm layer 4 is also removed, which is illustrated by FIG. 1h.

In conclusion, it may still be pointed out that the microphone structure may optionally also be provided with protective layers, such as anti-adhesive layers or anti-corrosion layers.

What is claimed is:

1. A method for manufacturing a MEMS structural component, the method comprising:
    providing at least one deflectable diaphragm, which spans an opening in a rear side of the structural component and which is provided with at least one deflectable electrode of a capacitor system; and
    providing a fixed counter-element having passage openings, the counter-element functioning as a carrier for at least one fixed electrode of the capacitor system;
    wherein the counter-element is patterned from the base substrate of the MEMS structural component and the deflectable diaphragm is implemented in a layered structure on the base substrate, wherein the base substrate is a monocrystalline silicon substrate;
    wherein the counter-element having the passage openings is created using a trench etching method, wherein the etching is performed from a front side of the base substrate, and in which trenches are produced in the front side of the base substrate, and the counter-element is undercut in a further etching via the trenches, a cavity being produced in the base substrate,
    wherein the front side of the base substrate is provided with an etching mask for creating and undercutting the counter-element, the etching mask having a lattice structure in an area of the trenches to be produced, so that the etching attack takes place in each case via the openings in the lattice structure, wherein the lattice structures in the etching mask are completely undercut when the counter-element is created, and wherein the lattice structures in the etching mask are closed after the counter-element is undercut by applying at least one intermediate layer on the masked front side of the base substrate.

2. The method of claim 1, wherein the front side of the base substrate is masked using a structured oxide layer, and after the counter-element is undercut, at least one oxide layer is deposited as an intermediate layer on the masked front side of the base substrate.

3. The method of claim 1, wherein at least one diaphragm layer is applied to the closed sequence of layers of the etching mask and at least one intermediate layer, and this diaphragm layer is structured for creating the diaphragm.

4. The method of claim 3, wherein at least one polysilicon layer is deposited as a diaphragm layer, and this polysilicon layer is at least one of doped and tempered.

5. The method of claim 1, wherein the rear side of the base substrate is thinned to open the rear side of a cavern under the counter-element.

6. The method of claim 5, wherein the rear side of the base substrate is at least one of ground and back-thinned using one of a dry etching process and a wet chemical etching process.

7. The method of claim 5, wherein the diaphragm is exposed in that the etching mask and at least one intermediate layer are removed at least in the diaphragm area via the cavern opened on the rear side and the passage openings in the counter-element.

8. The method of claim 1, wherein the deflectable diaphragm is implemented in the layered structure on the base substrate via spring elements.

9. The method of claim 8, wherein the spring elements are patterned from the deflectable diaphragm layer.

10. The method of claim 8, wherein stop structures are disposed above the spring elements.

11. The method of claim 8, wherein the diaphragm is fastening by the mask layer or the intermediate layer in an edge region of the structural component.

* * * * *